United States Patent [19]

Singh et al.

[11] Patent Number: 4,830,702
[45] Date of Patent: May 16, 1989

[54] HOLLOW CATHODE PLASMA ASSISTED APPARATUS AND METHOD OF DIAMOND SYNTHESIS

[75] Inventors: Bawa Singh, Cherry Hill; Yehuda Arie, East Windsor; Ormond R. Mesker, Lambertville, all of N.J.

[73] Assignee: General Electric Company, Schenectady, N.Y.

[21] Appl. No.: 68,863

[22] Filed: Jul. 2, 1987

[51] Int. Cl.⁴ ............................................. C23C 16/00
[52] U.S. Cl. ..................... 156/613; 156/614; 156/DIG. 68; 427/39; 427/42; 118/723; 423/446
[58] Field of Search ................... 118/723; 204/192.31, 204/164; 423/446; 156/613, 614, DIG. 68; 427/39, 42

[56] References Cited

U.S. PATENT DOCUMENTS

| | | | |
|---|---|---|---|
| 3,030,187 | 4/1962 | Eversole. | |
| 4,340,462 | 7/1982 | Koch | 204/298 |
| 4,434,188 | 2/1984 | Kamo et al. | |
| 4,440,108 | 4/1984 | Little | 118/723 |
| 4,490,229 | 12/1984 | Mirtich | 423/446 |
| 4,593,644 | 6/1986 | Hanak | 118/723 |

FOREIGN PATENT DOCUMENTS 0161829 11/1985 Japan.
61-194180 8/1986 Japan.

OTHER PUBLICATIONS

K. Suzuki, "Growth of Diamond Thin Films by DC Plasma Chemical Vapor Deposition", *Appl. Phys. Lett.* 50 (12), American Institute of Physics, Mar. 23, 1987, pp. 728 and 729.

Primary Examiner—Richard Bueker
Attorney, Agent, or Firm—William Squire; James C. Davis, Jr.; Paul R. Webb, II

[57] ABSTRACT

The present invention includes an apparatus and method for depositing diamond on a substrate. A hydrocarbon/hydrogen gas mixture is passed through a refractory metal hollow cathode which is self heated to a high temperature. The gas mixture is dissociated by a combination of thermal and plasma effects. The plasma plume emanating from the hollow cathode heats the substrate which is positioned on a surface of the anode. Growth of the diamond film is enhanced by bombardment of electrons.

7 Claims, 1 Drawing Sheet

HOLLOW CATHODE PLASMA ASSISTED APPARATUS AND METHOD OF DIAMOND SYNTHESIS

The present invention relates to the synthesis of diamond on a substrate utilizing a chemical vapor deposition process.

BACKGROUND OF THE INVENTION

Diamond possesses many desirable physical properties such as hardness, chemical inertness, infrared transparency, and excellent heat conductivity coupled with very high electrical resistivity. Consequently, diamond is a material with many important technological applications such as in optical devices, semiconductors, heat sinks, abrasives, tool coating etc. It can also be used as a high-grade, radiation resistant, high-temperature semiconductor with potential application in many military and aerospace technologies. There is considerable incentice to find practical ways to synthesize diamond for these many and varied applications.

A prior art thermal dissociation low pressure chemical vapor deposition (LPCVD) system is shown in FIG. 1. It consists essentially of a quartz tube 10 typically a few inches in diameter and 8 inches high enclosed at each end by suitable end pieces 12. The diamonds are synthesized from a dilute mixture of a hydrocarbon gas (typically methane) and hydrogen. The hydrocarbon content is usually varied from 0.1 to 2.5% of the total volumetric flow. The gas is introduced via a quartz tube 14 located just above a hot tungsten filament 16 which is electrically heated to between 1750°-2150° C. The gas dissociates at the filament surface, and diamonds are condensed onto a heated substrate 18. The substrate is held in a resistance heated molybdenum boat 20 and heated to temperatures in the region of 700°-1100° C.

Additionally, plasma discharge has been used in conjunction with the basic system described above. The plasma discharge serves to increase the nucleation density, growth rate, and it is believed, to enhance formation of diamond films as opposed to discrete particles. The formation of diamond films is important in many applications such as for use as semiconductor materials. Of the plasma systems that have been utilized in this area, there are only three basic systems. One is a microwave plasma system, the second is an RF (inductively or capacitively coupled) plasma system and the third is a D.C. plasma system. The RF and the microwave plasma systems utilize relatively complex and expensive equipment which usually requires complex tuning or matching networks to electrically couple electrical energy to the generated plasma. Additionally, the diamond growth rate offered by these two systems is quite modest, about 1 micron per hour.

What is needed is a diamond synthesis system capable of very high growth rates over large areas which is relatively simple in structure and operation, and which includes the advantageous characteristics of both thermal LPCVD and plasma LPCVD systems.

SUMMARY OF THE INVENTION

The present invention includes a method and apparatus for the deposition of diamond on a surface of a substrate. The apparatus includes a reaction chamber, a hot cathode and an anode spaced from the hot cathode, both of which are within the reaction chamber. Means is provided for heating the hot cathode as well as means for effecting a flow of reactant gas over the surface of the hot cathode wherein dissociation of the reactant gas occurs. Additionally, means is provided for effecting a discharge within the reaction chamber thereby forming a plasma wherein ionization of the reactant gas occurs and diamond is deposited on the surface of the substrate.

DESCRIPTION OF THE PREFERRED EMBODIMENT

Figure 1:
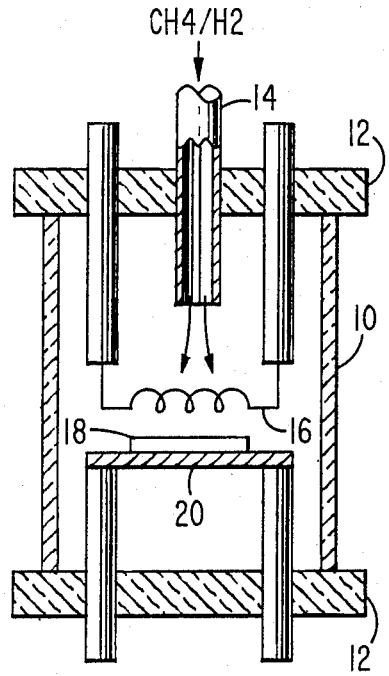
FIG. 1 illustrates a prior art thermal dissociation LPCVD reactor for deposition of diamond.
Figure 2:
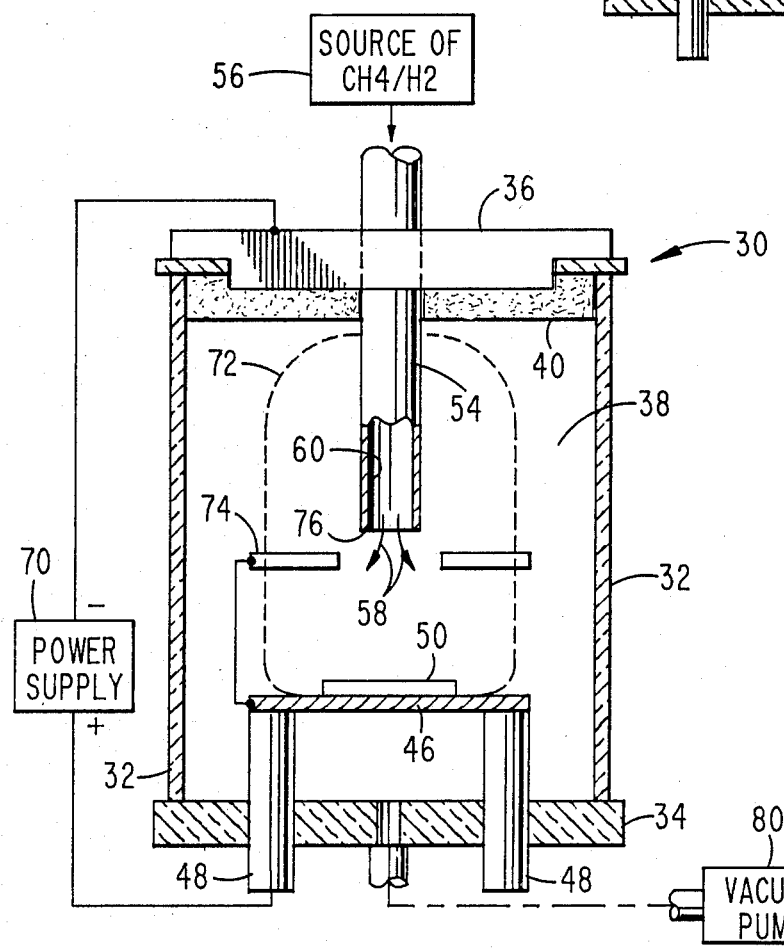
FIG. 2 illustrates a hollow cathode, plasma assisted reactor incorporating the teachings of the present invention.

There is shown in FIG. 2 a thermal dissociation chemical vapor deposition system 30. An outer casing 32 is in sealing engagement with a bottom cover 34 and a top cover 36 thereby forming a reaction chamber 38 therewithin. The casing 32 and bottom cover 34 may be constructed of quartz or other suitable material. The top cover 36 is removable to provide access to the reaction chamber 38. A layer 40 of high temperature insulating material is disposed within the reaction chamber 38 adjacent the inside surface of the top cover 36 for a purpose that will be explained below.

A substrate holder for holding a substrate 50 is supported in the lower portion of the reacting chamber 38, as viewed in FIG. 2, by a pair of supports 48. The supports 48 may be electrically connected to resistance heating elements, not shown, which may be embedded within the substrate holder 46 for preheating the substrate 50 as will be explained below. Such embedded heating elements and their electrical connections are well known in the art. The substrate holder 46 is constructed of an electrically conducting material, such as refractory metal, so that it will serve as an anode.

A heated, hollow cathode 54 projects from the top cover 36, inwardly toward the substrate holder 46. The hot cathode 54, in the present example, has an outside diameter of about 5 mm, an inside diameter of about 3 mm, and a length of about 3 to 5 cm. A source 56 of a reactant gas is arranged in communication with the hollow portion of the hot cathode 54 so that reactant gas 58 will flow across the interior surface 60 of the hollow portion and into the reaction chamber 38 adjacent the substrate holder 46. While the hot cathode may be of any suitable refractory metal, in the present example it is made of tungsten tubing and the surface 60 is the interior wall of the tubing. The top cover 36 which supports the hot cathode 54, is water cooled by any suitable means as known per se in the art. A D.C. power supply 70 is electrically connected to one of the supports 48 and to the top cover 36 which in turn is electrically connected to the hot cathode 54. The reactant gas 58 is a hydrocarbon gas mixture which may, for example, be a mixture of about 1 part methane and 99 parts hydrogen. The gas mixture is admitted into the reactor chamber 38 through the interior of the hollow cathode.

In operation the pressure within the reactor chamber 38 is reduced by means of the vacuum pump 80. A D.C. discharge is effected which forms a plasma plume 72 that emanates from the tip of the cathode. At appropriate flow/gas pressure conditions the plasma will fill most of the volume of the reactor chamber 38. The gas mixture is dissociated by a combination of thermal and plasma effects. At sufficient discharge currents the hollow-cathode self-heats to very high temperatures (in excess of 2000° C) so that a hot zone is formed somewhere near the tip. This hot zone is hot enough to cause thermionic emission of electrons from the cathode surface. An intense plasma exists inside the hollow cathode so that the gas mixture being fed into the interior of the hollow cathode and passing through the cathode nozzle is probably quite highly ionized, and also heated, both by electric fields of the plasma and thermal contact with the cathode walls.

In addition, since about 1-2 cm of the cathode tip are around 2000°-2300° C., additional thermal dissociation of the gas can take place. On emerging from the cathode, the dissociated species are in a relatively field-free plasma (usually referred to as the positive column). The species traverses through this plasma and impinge on the substrate 50 which is located some distance in front of the cathode tip. Since the substrate is situated on the anode, or substrate holder 46 the growing film is subjected to electron bombardment. Electron bombardment during growth will increase both the nucleation density and growth rate as is known per se in the art.

Since the anode is bombarded by electrons, it will be heated to temperatures of about 800° C. Thus, at appropriate discharge conditions, no external heating of the substrate will be needed. However, it may be desirable to preheat the substrate to its operating temperature to minimize the possibility of deposition of carbon onto the surface of the substrate prior to sufficient heating by the plasma. Hence, the resulting system is relatively simple using a single power supply to achieve dissociation of the gas mixture, to heat the substrates, and cause electron bombardment of the substrates. The conventional hot filament, needed in order to dissociate the methane/hydrogen mixtures in the prior art thermal CVD configuration is eliminated. Since the temperatures within the reaction chamber 38 exceed 2000° C., the insulating layer 40 is provided to protect the top cover 36. Additionally, as set forth above, the top cover 36 is water cooled to provide further protection.

Using the above described embodiment of the present invention, diamond growth was achieved on a diamond seeded substrate of about eight times the volume of the seed in about one hour.

An alternative embodiment includes an auxiliary anode 74 disposed within the reaction chamber 38 between the tip 76 of the hot cathode 54 and the substrate holder 46, as shown in FIG. 2. The auxiliary anode 74, which may or may not be water cooled, is electrically connected to the substrate holder 46 and heater arrangement to enhance electron bombardment of the growing film.

While numerous alternative structures will become apparent to those skilled in the art upon reading the present disclosure, such alternative structures are considered to be within the spirit and scope of the following claims. Such alternative structures include, but are not limited to, a hot cathode having a surface other than an interior surface across which the reactant gas is flowed, and the use of low frequency power supply in place of the D.C. power supply 70.

The very important advantages of the present invention over prior art systems includes:

(1) enhanced dissociation of the gases by means of both a hot surface and an intense DC plasma;

(2) increased growth rate of the diamond film due to bombardment by electrons;

(3) a simplified system having a single relatively low voltage power supply for both dissociating the gas mixture and heating the substrate;

(4) there is no significant sputtering of the cathode due to the relatively low discharge voltage; and (5) self heating of the cathode due to back bombardment of ions and thermionic emission of electrons which yields an extended hot zone.

What is claimed is:

1. In an apparatus for deposition of diamond on a surface of a substrate,
  (a) a reaction chamber;
  (b) a self heating hot cathode within said reaction chamber, said cathode having a temperature of at least about 2000° C.;
  (c) means for heating said hot cathode;
  (d) an anode within said reaction chamber spaced from said hot cathode;
  (e) means for effecting a flow of carbonacious reactant gas over a surface of said hot cathode, wherein heating and dissociation of said reactant gas occurs; and
  (f) means for effecting a discharge within said reaction chamber thereby forming a plasma wherein ionization and heating of said reactant gas occurs such that the gas is dissociated and ionized and thermionic emmission of electrons occurs from the cathode surface and diamond is deposited on said surface of said substrate.

2. The apparatus set forth in claim 1 wherein said discharge is a D.C. discharge.

3. The apparatus set forth in claim 2 wherein said hot cathode has a hollow portion terminating in an opening adjacent said anode, wherein said means for effecting a flow of reaction gas over a surface causes said reaction gas to flow through said hollow portion.

4. The apparatus set forth in claim 3 wherein said hot cathode is tubular shaped having a hollow interior, said hollow portion being said hollow interior.

5. The apparatus set forth in claim 4 wherein said reactant gas is a mixture of a hydrocarbon gas and a hydrogen gas.

6. The apparatus set forth in claim 5 wherein said reactant gas is a mixture of methane and hydrogen.

7. In a method of depositing diamond on a substrate in a reaction chamber, the steps:
  (a) heating a hot cathode within said reaction chamber so that the cathode self heats to a temperature of at least about 2000° C.;
  (b) flowing a carbonacious reactant gas across a surface of said hot cathode to cause heating and dissociation of said gas;
  (c) effecting an electrical discharge thereby forming a plasma within said reaction chamber to heat and ionize said reactant gas such that the gas is dissociated and ionized and thermionic emission of electron occurs from the cathode surface; and
  (d) heating said substrate within said reaction chamber thereby depositing diamond on a surface of said substrate.

* * * * *